United States Patent
Kim et al.

(10) Patent No.: US 11,522,037 B2
(45) Date of Patent: Dec. 6, 2022

(54) DISPLAY PANEL INCLUDING PADS ON SIDE SURFACE THEREOF ADJACENT CONNECTION LINES HAVING REDUCED WIDTHS

(71) Applicant: Samsung Display Co., Ltd., Yongin-Si (KR)

(72) Inventors: Byoungyong Kim, Seoul (KR); JeongJin Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 170 days.

(21) Appl. No.: 17/015,753

(22) Filed: Sep. 9, 2020

(65) Prior Publication Data
US 2021/0074799 A1 Mar. 11, 2021

(30) Foreign Application Priority Data

Sep. 10, 2019 (KR) .................. 10-2019-0112215

(51) Int. Cl.
*H01L 27/32* (2006.01)
*H01L 51/56* (2006.01)
*G09G 3/3233* (2016.01)

(52) U.S. Cl.
CPC .......... *H01L 27/3276* (2013.01); *H01L 51/56* (2013.01); *G09G 3/3233* (2013.01)

(58) Field of Classification Search
CPC .. H01L 27/3276; H01L 27/3288; H01L 51/56
USPC .................................................. 257/40, 88
See application file for complete search history.

(56) References Cited

U.S. PATENT DOCUMENTS

| | | | |
|---|---|---|---|
| 6,522,378 B1 * | 2/2003 | Mizuno ................. | G02F 1/1345 349/139 |
| 10,303,016 B2 | 5/2019 | Son et al. | |
| 2005/0237445 A1 * | 10/2005 | Grupp ................... | C23C 14/225 349/98 |
| 2014/0339574 A1 * | 11/2014 | Kang ................... | G02F 1/13452 257/88 |
| 2016/0306248 A1 | 10/2016 | Kang et al. | |
| 2019/0124756 A1 | 4/2019 | Uchida et al. | |
| 2019/0124757 A1 | 4/2019 | Ng et al. | |
| 2020/0341321 A1 * | 10/2020 | Cho ....................... | G02F 1/1368 |

FOREIGN PATENT DOCUMENTS

| | | |
|---|---|---|
| KR | 1020010034627 A | 4/2001 |
| KR | 1020140136233 A | 11/2014 |
| KR | 1020150074275 A | 7/2015 |
| KR | 1020180028096 A | 3/2018 |

* cited by examiner

*Primary Examiner* — Matthew E. Gordon
(74) *Attorney, Agent, or Firm* — Cantor Colburn LLP

(57) ABSTRACT

A display device includes a first substrate and a second substrate, and the first substrate includes a plurality of connection lines disposed to extend to an end of the first substrate and a plurality of pads disposed on a side surface of the first substrate and electrically connected to the plurality of connection lines, respectively. Each of the plurality of connection lines includes a first area and a second area extending from the first area, the first area has a width greater than a width of the second area, and the width of the second area is substantially the same as a width of each of the plurality of pads.

14 Claims, 14 Drawing Sheets

DISPLAY PANEL INCLUDING PADS ON SIDE SURFACE THEREOF ADJACENT CONNECTION LINES HAVING REDUCED WIDTHS

This application claims priority to Korean Patent Application No. 10-2019-0112215, filed on Sep. 10, 2019, and all the benefits accruing therefrom under 35 U.S.C. § 119, the content of which in its entirety is herein incorporated by reference.

BACKGROUND

1. Field

The disclosure relates to a display panel, and a display device including the same and manufacturing method thereof, and more particularly, to a display device including a flexible circuit board attached to a side surface of a display module thereof.

2. Description of the Related Art

Various display devices used in multimedia devices such as televisions, mobile phones, tablet computers, navigation units, and game consoles have been developed. Each of the display devices provides various images and videos to a user through a display surface.

SUMMARY

A display surface of a display device typically includes a display area on which an image is displayed and a non-display area on which an image is not displayed. Recently, researches for reducing a bezel area that is the non-display area of the display device have been actively performed. However, since a driving circuit board for generating a signal for driving the display device is typically disposed on the non-display area, and the driving circuit board has a predetermined size, there is a limitation in reduction of the non-display area.

The disclosure provides a display panel having a reduced bezel area and a display device including the display panel.

The disclosure also provides a method for manufacturing a display device having improved reliability.

An embodiment of the invention provides a display panel including: a base layer including a display area and a non-display area adjacent to the display area; a plurality of connection lines disposed on the non-display area of the base layer, and extending to a side surface of the base layer; and a plurality of pads disposed on the side surface and electrically connected to the plurality of connection lines, respectively. In such an embodiment, each of the plurality of connection lines includes a first area adjacent to the display area and a second area extending from the first area to the side surface of the base layer, the second area is disposed adjacent to the plurality of pads, the first area has a width greater than a width of the second area, and the width of the second area is substantially the same as a width of each of the plurality of pads.

In an embodiment, opposing sides of the second area of each of the plurality of connection lines may coincide with opposing sides of each of the plurality of pads.

In an embodiment, the plurality of connection lines may contact the plurality of pads, respectively.

In an embodiment, the plurality of connection lines may be spaced apart from each other with a substantially constant interval, and the plurality of pads may be spaced apart from each other with a substantially constant interval.

In an embodiment, the plurality of connection lines may be spaced apart from each other at a distance in a range from about 5 micrometers (μm) to about 15 μm, the plurality of pads may be spaced apart from each other at a distance in a range from about 5 μm to about 15 μm, and each of the plurality of pads may have a width in a range from about 5 μm to about 15 μm.

In an embodiment of the invention, a display device includes: a first substrate; and a second substrate disposed on the first substrate and including an input sensing unit. In such an embodiment, the first substrate includes: a base layer including a display area and a non-display area; a plurality of connection lines disposed on the non-display area of the base layer, and extending to a side surface of the base layer; and a plurality of pads disposed on the side surface and electrically connected to the plurality of connection lines, respectively. In such an embodiment, each of the plurality of connection lines includes a first area and a second area extending from the first area to the side surface of the base layer, the second area is disposed adjacent to the plurality of pads, the first area has a width greater than a width of the second area, and the width of the second area is substantially the same as a width of each of the plurality of pads.

In an embodiment, opposing sides of the second area of the plurality of connection lines may coincide with opposing sides of each of the plurality of pads.

In an embodiment, the plurality of connection lines may contact the plurality of pads, respectively.

In an embodiment, the plurality of connection lines may be spaced apart from each other with a substantially constant interval, and the second areas of the plurality of connection lines may be spaced apart from each other at a distance in a range from about 5 μm to about 15 μm from each other.

In an embodiment, the plurality of pads may be spaced apart from each other with a substantially constant interval, and a distance between two adjacent pads of the plurality of pads may be in a range from about 5 μm to about 15 μm.

In an embodiment, each of the plurality of pads may have a width in a range from about 5 μm to about 15 μm.

In an embodiment, the display device may further include a driving circuit board electrically connected to the plurality of pads.

In an embodiment, the driving circuit board may be a flexible circuit board.

In an embodiment, the first substrate may further include a light emitting element disposed on the display area.

In an embodiment of the invention, a method for manufacturing a display device includes: preparing a first substrate in which a plurality of first connection lines is provided on a base layer; disposing a second substrate on the first substrate; providing a metal plate on one side surface of each of the first substrate and the second substrate to be electrically connected to each of the plurality of first connection lines; forming a plurality of second connection lines and a plurality of pads by irradiating the plurality of first connection lines and the metal plate with a laser, respectively; and bonding a driving circuit board to each of the plurality of pads. In such an embodiment, each of the plurality of second connection lines includes: a first area; a second area extending from the first area to the side surface to be adjacent to the plurality of pads. In such an embodiment, the first area has a width greater than a width of the second area, and the second area has the substantially same width as a width of each of the plurality of pads.

In an embodiment, the side surface may include a connection area in which the plurality of pads are provided, and the metal plate may overlap an entire surface of the connection area.

In an embodiment, the forming the plurality of second connection lines and the plurality of pads by irradiating the plurality of first connection lines and the metal plate with the laser, respectively, may include: removing a first removal area by irradiating the plurality of first connection lines with the laser to form the plurality of second connection lines; and removing a second removal area by irradiating the metal plate with the laser to form the plurality of pads, and the removing of the first removal area and the removing of the second removal area may be performed simultaneously with each other.

In an embodiment, opposing sides of the second area of each of the plurality of second connection lines may coincide with and contact opposing sides of each of the plurality of pads.

In an embodiment, the plurality of second connection lines may be spaced apart from each other with a substantially constant interval, and the plurality of pads may be spaced apart from each other with a substantially constant interval.

In an embodiment, the second areas of the plurality of second connection lines may be spaced apart from each other at a distance in a range from about 5 μm to about 15 μm, the plurality of pads may be spaced apart from each other at a distance in a range from about 5 μm to about 15 μm, and each of the plurality of pads may have a width in a range from about 5 μm to about 15 μm.

BRIEF DESCRIPTION OF THE DRAWINGS

The above and other features of embodiments of the invention will become readily apparent by reference to the following detailed description of exemplary embodiments when considered in conjunction with the accompanying drawings, in which.

DETAILED DESCRIPTION

Figure 1:
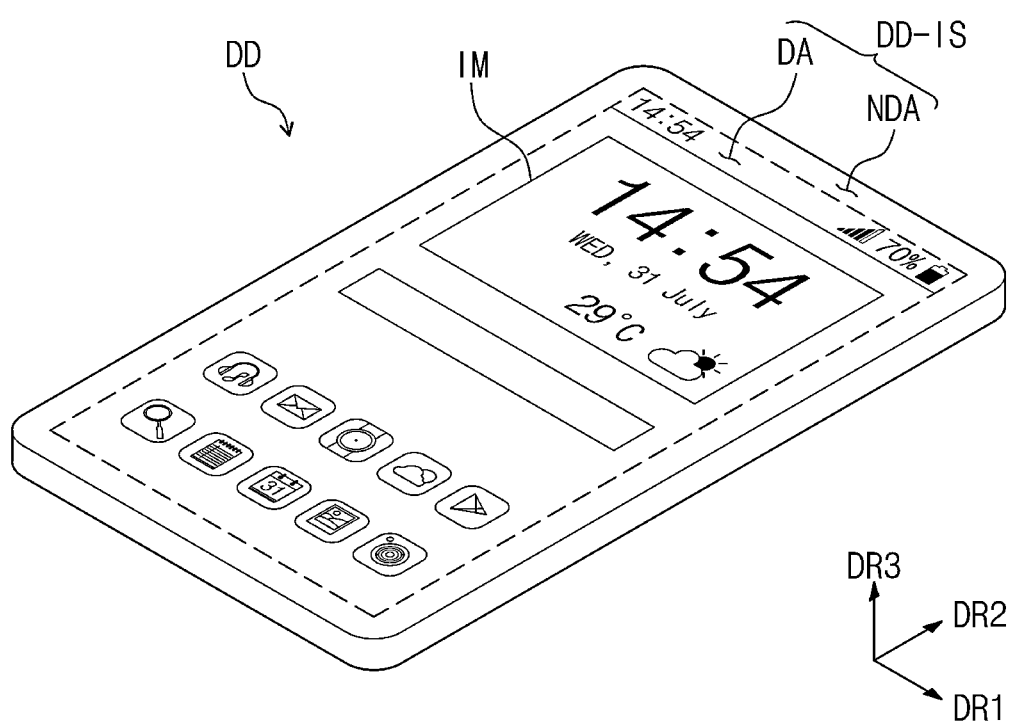
FIG. 1 is a perspective view illustrating a display device according to an embodiment.

The invention now will be described more fully hereinafter with reference to the accompanying drawings, in which various embodiments are shown. The invention may, however, be embodied in many different forms, and should not be construed as limited to the embodiments set forth herein. Rather, these embodiments are provided so that this disclosure will be thorough and complete, and will fully convey the scopes of the invention to those skilled in the art. Like reference numerals refer to like elements throughout.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

In this application, it will be understood that a term of "substantially the same as" represents that numerical ranges described in the specification are the same as each other including process errors that generally occur.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present. In contrast, when an element is referred to as being "directly on", or " directly under" another element or layer, there are no intervening elements present. Also, in this specification, a structure in which a layer, a film, a region, or a plate is disposed "on" another layer, film, region, or plate may include a structure in which the layer, film, region, or plate is disposed on a lower portion as well as an upper portion of another layer, film, region, or plate.

In this application, it will be understood that when a layer, a film, a region, or a plate is "directly contact" another layer, film, region, or plate, further another layer, film, region, or plate is not present therebetween. For example, a feature of "directly contact" may represent that two layers or two members are disposed without using an additional member such as an adhesive member.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Hereinafter, embodiments of a display panel, embodiments of a display device including the display panel, and embodiments of a manufacturing method of the display panel according to the invention will be described with reference to the accompanying drawings.

Figure 2:
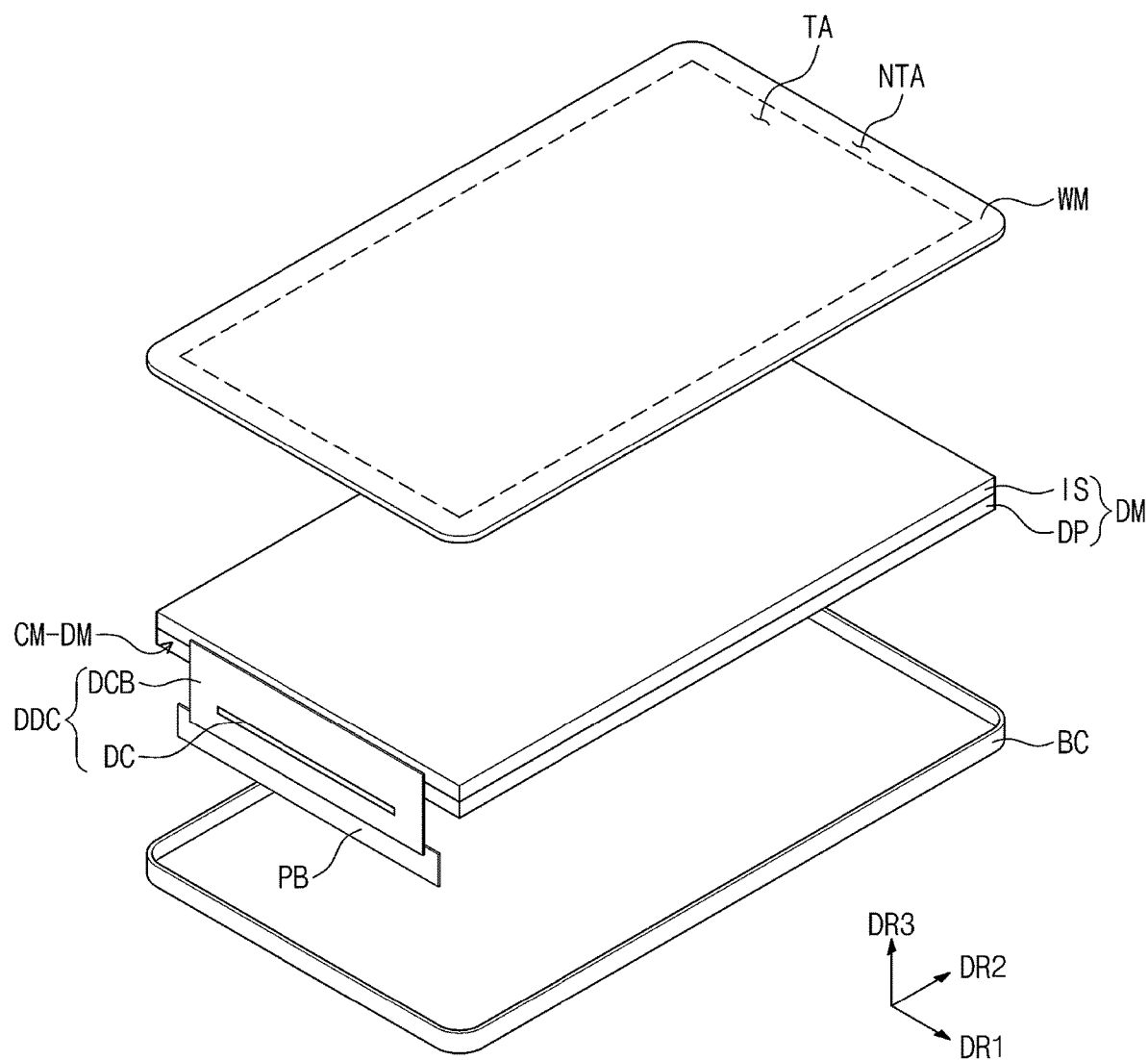
FIG. 2 is an exploded perspective view illustrating the display device according to an embodiment.
Figure 3:
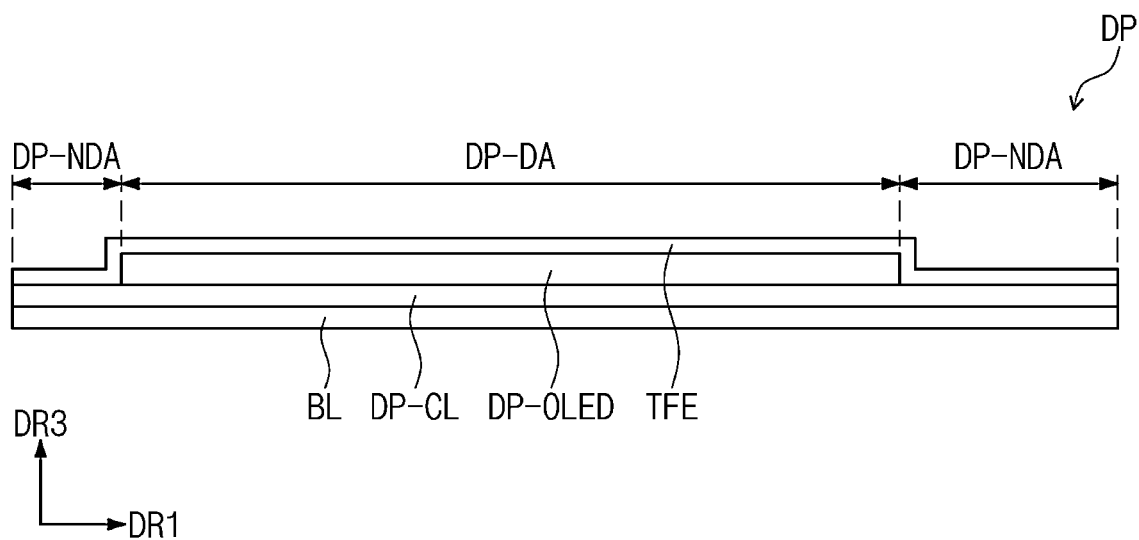
FIG. 3 is a cross-sectional view illustrating a first substrate according to an embodiment.
Figure 4A:
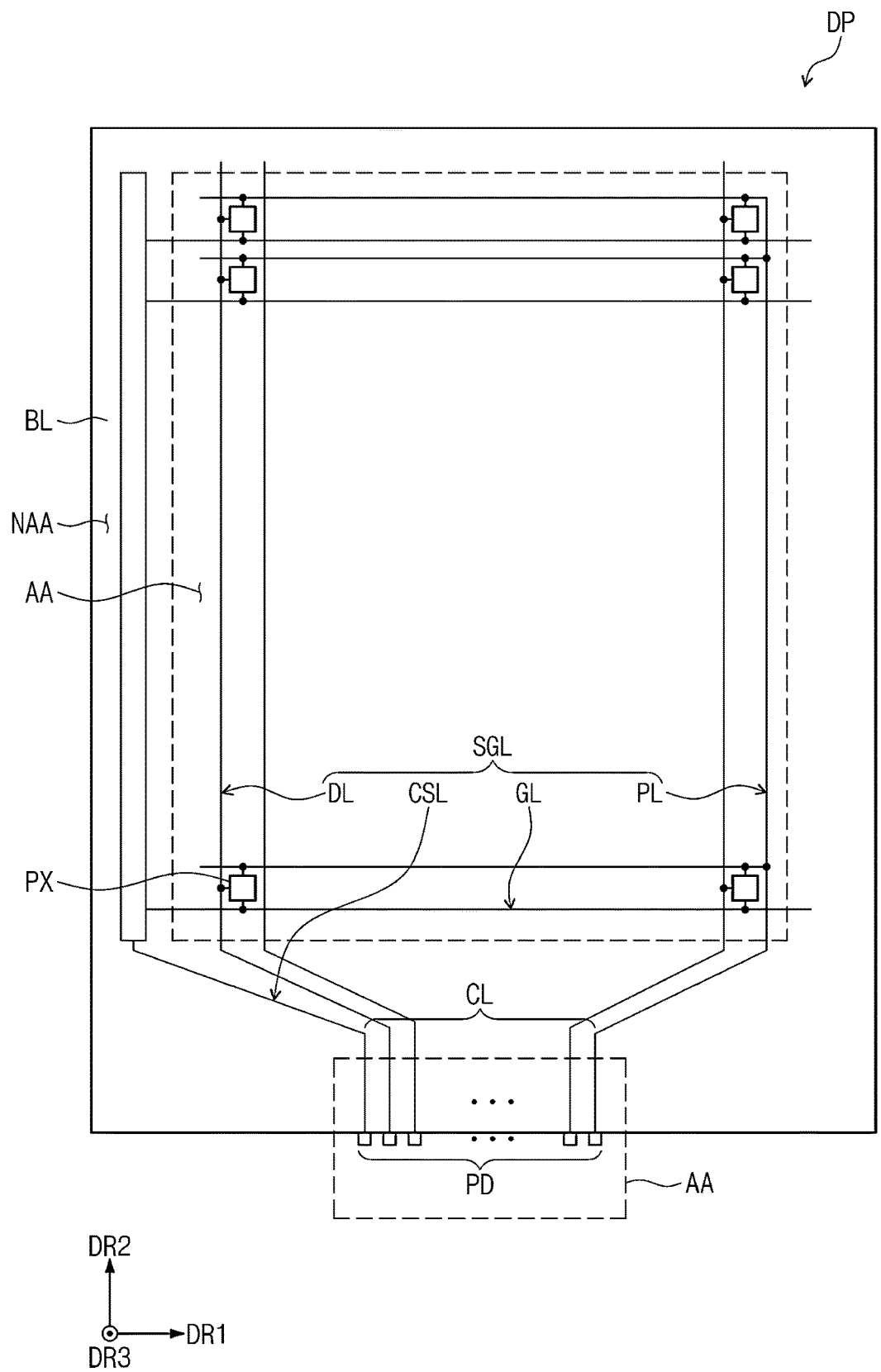
FIG. 4A is a plan view illustrating the first substrate according to an embodiment.
Figure 4B:
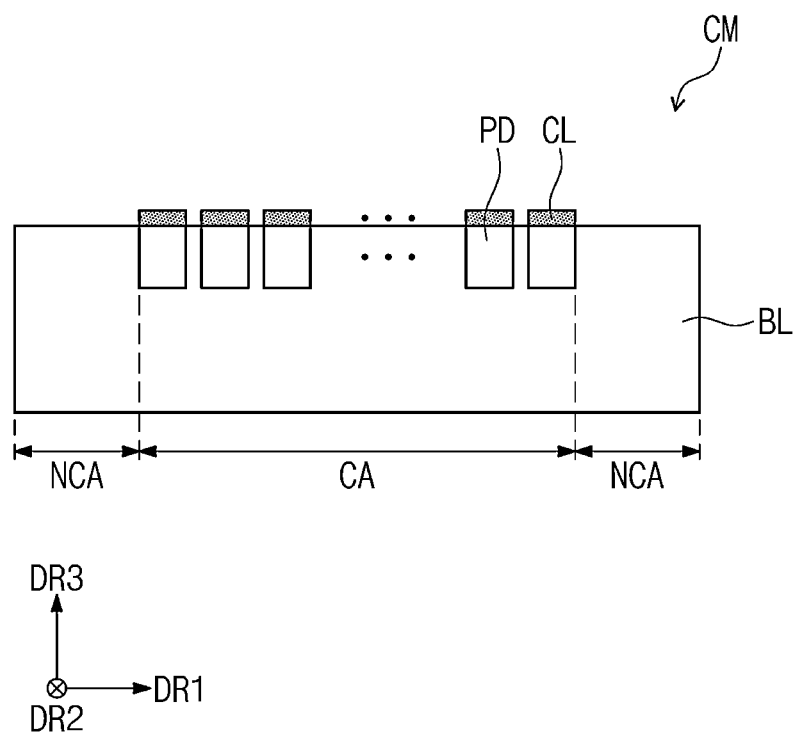
FIG. 4B is a side view illustrating the first substrate according to an embodiment.
Figure 5:
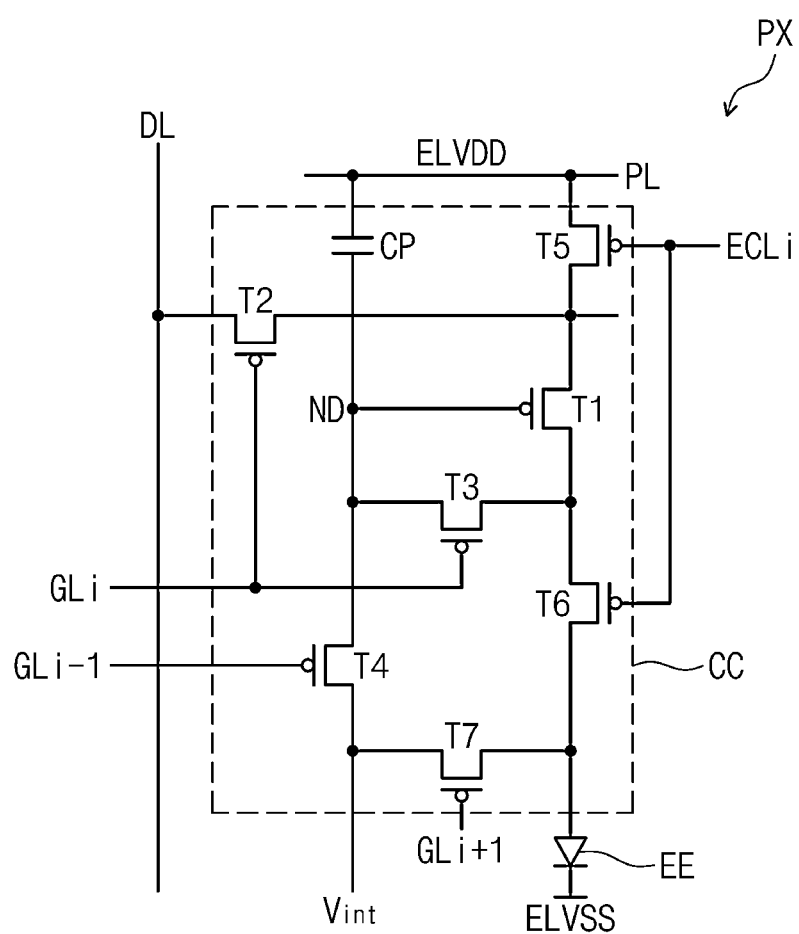
FIG. 5 is an equivalent circuit diagram illustrating a pixel according to an embodiment.

FIG. 1 is a perspective view illustrating a display device DD according to an embodiment. FIG. 2 is an exploded perspective view illustrating the display device DD according to an embodiment. FIG. 3 is a cross-sectional view illustrating a first substrate DP according to an embodiment. FIG. 4A is a plan view illustrating the first substrate DP according to an embodiment. FIG. 4B is a side view illustrating the first substrate according to an embodiment. FIG. 5 is an equivalent circuit diagram illustrating a pixel PX according to an embodiment.

Referring to FIG. 1, an embodiment of the display device DD may include a display surface DD-IS. In such an embodiment, a display area DA and a non-display area NDA may be defined on the display surface DP-IS. The display area DA may be an area on which an image IM is displayed. In an embodiment, as shown in FIG. 1, the image IM disposed on the display area DA may be an icon. The non-display area NDA may be an area on which the image IM is not displayed. Pixels may be disposed in the display area DA and may not be disposed in the non-display area NDA. The pixels may represent valid pixels for providing the image IM.

The display area DA is parallel to a surface defined by a first direction DR1 and a second direction DR2. A normal direction of the display area DA, i.e., a thickness direction of the display device DD, indicates a third direction DR3. A front surface (or a top surface) and a rear surface (or a bottom surface) of each of members are distinguished by the third direction DR3. However, directions indicated by the first to third directions DR1, DR2, and DR3, as relative concepts, may be converted with respect to each other. Hereinafter, first to third directions may be indicated by the first to third directions DR1, DR2, and DR3 and designated by the same reference numerals, respectively.

In an embodiment, as shown in FIG. 1, the display device DD may be a mobile terminal, for example. Although not shown, electronic modules, a camera module, and a power module, which are mounted on a main board, may be disposed on a bracket or a case in conjunction with the display device DD to provide a mobile phone terminal. An embodiment of the display device DD may be used for large-sized electronic devices such as televisions and monitors and small and medium-sized electronic devices such as tablet computers, navigation units for vehicles, game consoles, and smart watches.

The non-display area NDA may define a bezel area of the display device DD. The non-display area NDA may be adjacent to the display area DA. The non-display area NDA may surround the display area DA. However, the embodiment of the invention is not limited thereto. In one embodiment, for example, the display area DA and the non-display area NDA may be relatively designed in shape. In an alternative embodiment of the invention, the non-display area NDA may be omitted.

In an embodiment, as shown in FIG. 1, the display device DD may have a flat display surface DD-IS, but the embodiment of the invention is not limited thereto. In one alternative embodiment, for example, the display device DD may include a curved display surface or a three-dimensional display surface. The three-dimensional display surface may include a plurality of display areas indicating directions different from each other.

Referring to FIG. 2, an embodiment of the display device DD may include a window WM, a display module DM, a driving circuit DDC, a printed circuit board PB, and an accommodation member BC. The accommodation member BC may be coupled to the window member WM to accommodate the display panel DP.

The window WM may be disposed above the display module DM and transmit an image provided from the display module DM to an outside. The window WM includes a transmission area TA and a non-transmission area NTA. The transmission area TA may overlap the display area DA and have a shape corresponding to the display area DA when viewed from a plan view in the third direction DR3. The image displayed on the display area DA of the display device DD may be seen from the outside through the transmission area TA of the window WM.

The non-transmission area NTA may overlap the non-display area NDA and have a shape corresponding to the non-display area NDA. The non-transmission area NTA may has a relatively lower light transmittance than that of the transmission area TA. The non-transmission area NTA may overlap a bezel area defined in the non-display area NDA of the display device DD when viewed from a plan view in the third direction DR3. However, the embodiment of the invention is not limited thereto. In one alternative embodiment, for example, the non-transmission area NTA may be omitted. The window WM may include or be made of a glass, sapphire, or a plastic. In an embodiment, the window WM may have a single layer structure, but not being limited thereto. Alternatively, the window WM may include or be defined by a plurality of layers. The window WM may include a base layer and at least one printed layer disposed to overlap the non-transmission area NTA on a rear surface of the base layer. The printed layer may have a predetermined color. In one embodiment, for example, the printed layer may have a black color or another color besides the black color.

The display module DM is disposed between the window WM and the accommodation member BC. The display module DM includes a first substrate DP and a second substrate IS. The first substrate DP may be a display panel. Hereinafter, the first substrate DP may be referred to as the display panel.

The first substrate DP may generate an image and transmit the generated image to the window WM. According to an embodiment of the invention, the first substrate DP may be a light emitting display panel. However, the embodiment of the invention is not limited to a particular type of the first substrate DP. In one embodiment, for example, the first substrate DP may be one of a liquid crystal display panel, an electrophoretic display panel, a microelectromechanical system ("MEMS") display panel, an electrowetting display panel, an organic light emitting display panel, a micro light emitting diode ("LED") display panel, a quantum dot display panel, and a quantum rod display panel. However, the embodiment of the invention is not limited thereto.

Although not separately shown, the first substrate DP may further include a chassis member or a molding member, and may further include a backlight unit according to the type of the first substrate DP. Hereinafter, for convenience of description, embodiments where the first substrate DP is an organic light emitting display panel will be described in detail. However, embodiments of the invention are not limited thereto. In such an embodiment, the first substrate DP may be one of various types of display panel.

The second substrate IS may be disposed on the first substrate DP. The second substrate IS may include an input sensing unit. The input sensing unit may include a sensing electrode, a signal line connected to the sensing electrode, and at least one insulation layer overlapping the display area DA and the non-display area NDA. The sensing electrode and the insulation layer may cross each other and be laminated with each other. The second substrate IS may further include an encapsulation substrate disposed on the input sensing unit. The encapsulation substrate may protect the input sensing unit from external impact, moisture, and oxygen. In such an embodiment, the encapsulation substrate may provide a base surface to the window WM disposed on the second substrate IS. Although not shown, the second substrate IS may include one of a retarder, a polarizer, and a color filter according to the type of the first substrate DP. Although not shown, a sealing member for coupling the first substrate DP and the second substrate IS may be disposed between the first substrate DP and the second substrate IS.

The sealing member may be disposed to overlap the non-display area NDA of the display device DD.

The display device DD may include a driving circuit DDC and a printed circuit board PB, which provide an electrical signal to the first substrate DP and the second substrate IS. The driving circuit DDC may be provided as a tape carrier package ("TCP") type.

According to an embodiment of the invention, as shown in FIG. 2, the display device DD may include a single driving circuit DDC, but the embodiment of the invention is not limited thereto. Alternatively, the display device DD may include a plurality of driving circuits, and at least one of the plurality of driving circuits may include input pads providing a driving signal to the first substrate DP and the second substrate IS.

According to an embodiment of the invention, the driving circuit DDC may be disposed on one side surface CM-DM of the display module DM, but the embodiment of the invention is not limited thereto. In one alternative embodiment, for example, the driving circuit DDC may be provided in plurality and disposed on at least one side surface of the display module DM.

The driving circuit DDC may include a driving circuit board DCB and a driving chip DC. The driving chip DC may be disposed on the driving circuit board DCB. According to an embodiment, the driving circuit board DCB may be provided as a flexible printed circuit board. In one embodiment, for example, the driving circuit board DCB may be bent toward a bottom surface of the display module DM from a side surface DM-CM of the display module DM.

The driving chip DC may transmit a control signal transmitted from the printed circuit board PB. The driving chip DC may generate driving signals used for driving the first substrate DP based on the inputted control signal. The driving signals outputted from the driving chip DC may be transmitted to the first substrate DP through the driving circuit board DCB.

The driving circuit DDC may be electrically connected to the side surface CM-DM of the display module DM. In an embodiment, the driving circuit DDC may directly contact the side surface CM-DM of the display module DM through a metal direct bonding ("MDB") using an ultrasonic wave. In an embodiment, the driving circuit DDC may directly contact a plurality of pads PD (refer to FIG. 4A) disposed on the side surface CM-DM of the display module DM. However, the embodiment of the invention is not limited thereto.

In an embodiment, the printed circuit board PB may be electrically connected to the driving circuit DDC. The printed circuit board PB may be electrically connected to the plurality of pads PD disposed on the side surface CM-DM of the display module DM through the driving circuit DDC.

In an embodiment, as illustrated in FIG. 3, the first substrate DP includes a base layer BL, a circuit element layer DP-CL disposed on the base layer BL, a display element layer DP-OLED, and a thin-film encapsulation layer TFE. Although not shown, the first substrate DP may further include functional layers such as an anti-reflection layer and a reflective index adjusting layer.

The first substrate DP includes a display area DP-DA and a non-display area DP-NDA when viewed from a plan view in the third direction DR3. The display area DP-DA and the non-display area DP-NDA of the first substrate DP may correspond to the display area DP-DA and the non-display area DP-NDA of the display device DD in FIG. 1, respectively.

In an embodiment, the non-display area DP-NDA may be defined along an edge of the display area DP-DA. However, the embodiment of the invention is not limited thereto. In one embodiment, for example, the display area DP-DA and the non-display area DP-NDA may be relatively designed in shape. In an alternative embodiment of the invention, the non-display area DP-NDA may be omitted.

The base substrate BL may provide a base surface for the circuit element layer DP-CL. In an embodiment, the display area DP-DA and the non-display area DP-NDA of the first substrate DP may be defined on a plane of the base layer BL as described above. In such an embodiment, the display area DP-DA of the base layer BL may coincide with the display area DP-DA of the first substrate DP when viewed from a plan view in the third direction DR3. The non-display area DP-NDA of the base layer BL may coincide with the non-display area DP-NDA of the first substrate DP when viewed from a plan view in the third direction DR3.

In an embodiment, a driving circuit or driving lines may be disposed on the non-display area DP-NDA of the base layer BL. In an embodiment of the invention, a plurality of connection lines CL (refer to FIG. 4A) may be disposed on the non-display area DP-NDA of the base layer BL, for example. The plurality of connection lines CL will be described later in greater detail with reference to FIGS. 4A and 4B.

The base layer BL may include a synthetic resin film. A synthetic resin layer is provided on a working substrate used when the first substrate DP is manufactured. Thereafter, a conductive layer, an insulation layer, and the like are provided on the synthetic resin layer. When the working substrate is removed, the synthetic resin layer corresponds to the base layer BL. Although the synthetic resin layer may include a polyimide-based resin layer, the embodiment of the invention is not limited to the material of the synthetic resin layer. Alternatively, the base layer BL may include a glass substrate, a metal substrate, or an organic/inorganic composite substrate.

The circuit element layer DP-CL includes an insulation layer and a circuit element. Hereinafter, the insulation layer in the circuit element layer DP-CL is referred to as an intermediate insulation layer. The intermediate insulation layer includes an intermediate inorganic layer and an intermediate organic layer. The circuit element includes a signal line and a driving circuit of a pixel. The circuit element layer DP-CL may be provided through a process of forming an insulation layer, a semiconductor layer, and a conductive layer by coating, deposition, or the like and a process of patterning the insulation layer, the semiconductor layer, and the conductive layer by a photolithography process. In an embodiment of the invention, the plurality of connection lines CL may be disposed in the circuit element layer DP-CL.

The display element layer DP-OLED may include a light emitting element. The display element layer DP-OLED may further include an organic layer such as a pixel defining layer. The light emitting element may be an organic light emitting diode or a self light emitting element. The self light emitting element may include an organic light emitting element or a quantum dot light emitting element. However, the embodiment of the invention is not limited thereto.

The thin-film encapsulation layer TFE seals the display element layer DP-OLED. The thin-film encapsulation layer TFE includes at least one insulation layer. In an embodiment, the thin-film encapsulation layer TFE may include an inorganic layer (hereinafter, referred to as an inorganic encapsulation layer). In one embodiment, for example, the thin-film encapsulation layer TFE may include at least one organic layer (hereinafter, referred to as an organic encapsulation layer) and at least one inorganic encapsulation layer.

The inorganic encapsulation layer protects the display element layer DP-OLED from moisture/oxygen, and the organic encapsulation layer protects the display element layer DP-OLED from foreign substances such as dust particles. In an embodiment, the inorganic encapsulation layer may include a silicon nitride layer, a silicon oxynitride layer, a silicon oxide layer, a titanium oxide layer, or an aluminum oxide layer, but the embodiment of the invention is not particularly limited thereto. In an embodiment, the organic encapsulation layer may include an acrylic-based organic layer, but the embodiment of the invention is not particularly limited thereto.

Referring to FIG. 4A, a plurality of signal lines SGL, a plurality of pixels, and a plurality of connection lines CL may be disposed or provided on the base layer BL of the first substrate DP. Area AA in FIG. 4A may include the plurality of connection lines CL disposed on the base layer BL and the plurality of pads PD disposed outside the base layer BL in correspondence to the plurality of connection lines CL, respectively. The plurality of connection lines CL may be spaced apart from each other. In one embodiment, for example, the plurality of connection lines CL may be spaced apart from each other at a distance in a range from about 5 micrometers (µm) to about 15 µm. However, the embodiment of the invention is not limited thereto. In an embodiment, the plurality of pads PD may be spaced apart from each other at a predetermined distance or with a substantially constant interval. In one embodiment, for example, a distance between two adjacent pads PD may be in a range from about 5 µm to about 15 µm. However, the embodiment of the invention is not limited thereto.

FIG. 4B is a side view when the first substrate DP is viewed in the second direction DR2. Hereinafter, a side surface of the first substrate DP may be the same as a side surface CM of the base layer BL on a plane. Thus, the side surface of the first substrate DP in FIG. 4B may be the side surface CM of the base layer BL when the base layer BL is viewed in the second direction DR2.

The side surface CM of the base layer BL may include a connection area CA and a non-connection area NCA. The plurality of pads PD may be disposed on the side surface CM of the base layer BL. The connection area CA may be an area on which the plurality of connection lines CL and the plurality of pads PD are disposed. The non-connection area NCA may be an area on which the plurality of connection lines CL and the plurality of pads PD are not disposed.

In an embodiment, the plurality of connection lines CL may be spaced apart from each other on the connection area CA. The plurality of pads PD may be spaced from each other at a predetermined distance or with a substantially constant interval on the connection area CA.

According to an embodiment of the invention, the plurality of pads PD are disposed on a single side surface CM of the base layer BL, but the embodiment of the invention is not limited thereto. The plurality of pads PD may be disposed on a plurality of side surfaces of the other side surfaces of the base layer BL.

Referring to FIGS. 4A and 4B, the plurality of connection lines CL may are disposed on one end of the base layer BL, and the plurality of pads PD are disposed on the side surface CM of the base layer BL, which is adjacent to the one end, on which the plurality of connection lines CL are disposed, of the base layer BL. The plurality of pads PD may be electrically connected to the plurality of connection lines CL, respectively.

Referring back to FIG. 4A, the first substrate DP may include an active area AA and a peripheral area NAA. In such an embodiment, a plurality of pixels may be disposed on the active area AA. The active area AA may be an area on which an image is displayed. The peripheral area NAA may be an area on which a driving circuit or a driving line is disposed.

The plurality of connection lines CL may overlap the peripheral area NAA of the first substrate DP. The plurality of pads PD are disposed on the side surface CM of the base layer BL. In such an embodiment, the plurality of pads PD may be disposed on the side surface of the first substrate DP. As the second substrate IS is disposed on the first substrate DP, the plurality of pads PD may be disposed on the side surface CM-DM of the display module DM including the first substrate DP and the second substrate IS. Hereinafter, the plurality of pads PD will be described to be disposed on the side surface CM-DM of the display module DM.

In an embodiment, the driving circuit DDC may be electrically connected to the plurality of pads PD. In such an embodiment, as described above, the driving circuit DDC may be connected through an MDB using an ultrasonic wave to directly contact the plurality of pads PD. Thus, the driving circuit DDC may be disposed on the side surface CM-DM of the display module DM. In such an embodiment, where the driving circuit DDC is disposed on the side surface CM-DM of the display module DM, the display device DD may have a reduced dead space DS in comparison with a conventional display device in which a driving circuit is disposed on or below a driving circuit.

The plurality of signal lines SGL includes gate lines GL, data lines DL, a power line PL, and a control signal line CSL. Each of the gate lines GL is connected to a corresponding pixel PX of the pixels PX and each of the data lines DL is connected to a corresponding pixel PX of the pixels PX. The power line PL is connected to the plurality of pixels. In an embodiment, a gate driving circuit DCV connected to the gate lines GL may be disposed on the peripheral area NAA. The control signal line CSL may provide control signals to the gate driving circuit DCV.

Some of the gate lines GL, the data lines DL, the power line PL, and the control signal line CSL are disposed in a same layer as each other, and some of the gate lines GL, the data lines DL, the power line PL, and the control signal line CSL are disposed in different layers from each other. In such an embodiment, among the gate lines GL, the data lines DL, the power line PL and the control signal line CSL, signal lines disposed in one layer are defined as a first signal line, signal lines disposed in another layer may be defined as a second signal line. Signal lines disposed in a layer different from the one layer and the another layer may be defined as a third signal line.

FIG. 5 is an equivalent circuit diagram illustrating an embodiment of a pixel PX of the plurality of pixels in FIG. 4. The pixel PX may include a light emitting element EE and a pixel circuit CC.

The pixel circuit CC may include a plurality of transistors T1 to T7 and a capacitor CP. The plurality of transistors T1 to T7 may be provided through a low temperature polycrystalline silicon ("LTPS") process or a low temperature polycrystalline oxide ("LTPO") process.

The pixel circuit CC controls a current amount flowing through the light emitting element EE in response to a data signal. The light emitting element EE may emit light with predetermined luminance in response to the current amount provided from the pixel circuit CC. In such an embodiment, a first power ELVDD may be set to have a level greater than that of a second power ELVSS. The light emitting element EE may include an organic light emitting element or a quantum dot light emitting element.

Each of the plurality of transistors T1 to T7 may include an input electrode (or a source electrode), an output electrode (or a drain electrode), and a control electrode (or a gate electrode). Herein, for convenience, one of the input electrode and the output electrode may be referred to as a first electrode, and the other of the input electrode and the output electrode may be referred to as a second electrode.

The first transistor T1 includes a first electrode connected to the first power ELVDD through a fifth transistor T5 and a second electrode connected to an anode electrode of the light emitting element EE through a sixth transistor T6. The first transistor T1 may be referred to as a driving transistor.

The first transistor T1 controls the current amount flowing through the light emitting element EE in response to a voltage applied to the control electrode thereof.

The second transistor T2 is connected between a data line DL and the first electrode of the first transistor T1. Also, the second transistor T2 includes a control electrode connected to an i-th scan line GLi. The second transistor T2 is turned on when an i-th scan signal is provided to the i-th scan line GLi to electrically connect the data line DL and the first electrode of the first transistor T1.

The third transistor T3 is connected between the control electrode and the second electrode of the first transistor T1. The third transistor T3 includes a control electrode connected to the i-th scan line GLi. The third transistor T3 is turned on when the i-th scan signal is provided to the i-th scan line GLi to electrically connect the control electrode and the second electrode of the first transistor T1. Thus, when the third transistor T3 is turned on, the first transistor T1 is connected in a diode form.

The fourth transistor T4 is connected between a node ND and an initialization power generation part (not shown). Also, the fourth transistor T2 includes a control electrode connected to an (i−1)-th scan line GLi−1. The fourth transistor T4 is turned on when an (i−1)-th scan signal Si−1 is provided to the (i−1)-th scan line GLi−1 and provides an initialization voltage Vint to the node ND.

The fifth transistor T5 is connected between the power line PL and the first electrode of the first transistor T1. The fifth transistor T5 includes a control electrode connected to an i-th light emitting control line ECLi.

The sixth transistor T6 is connected between the second electrode of the first transistor T1 and the anode electrode of the light emitting element EE. Also, the sixth transistor T6 includes a control electrode connected to the i-th light emitting control line ECLi.

The seventh transistor T7 is connected between the initialization power generation part (not shown) and the anode electrode of the light emitting element EE. Also, the seventh transistor T7 includes a control electrode connected to an (i+1)-th scan line GLi+1. The seventh transistor T7 is turned on when the (i+1)-th scan signal is provided to the (i+1)-th scan line GLi+1 and provides the initialization voltage Vint to the anode electrode of the light emitting element EE.

The seventh transistor T7 may improve a black color expression of the pixel PX. In such an embodiment, when the seventh transistor T7 is turned on, a parasitic capacitor (not shown) of the light emitting element EE is discharged. Thus, when black luminance is realized, the light emitting element EE may not emit light due to a leakage current from the first transistor T1 and thus may have an improved black expression.

In an embodiment, as shown in FIG. 5, the seventh transistor T7 may have a control electrode connected to the (i+1)-th scan line GLi+1 in FIG. 5, but the embodiment of the invention is not limited thereto. In an alternative embodiment of the invention, the control electrode of the seventh transistor T7 may be connected to the i-th scan line GLi or the (i−1)-th scan line GLi−1.

The capacitor CP is disposed between the power line PL and the node ND. The capacitor CP stores a voltage corresponding to the data signal. Accordingly, a current amount flowing through the first transistor T1 when the fifth transistor T5 and the sixth transistor T6 are turned-on may be determined to correspond to the voltage stored in the capacitor CP.

The embodiment of the pixel PX according to the invention is not limited to the equivalent circuit of the pixel PX in FIG. 5. In an alternative embodiment of the invention, the pixel PX may be realized in various types for allowing the light emitting element EE to emit light. In an embodiment, as shown in FIG. 5, the pixel circuit CC may include p-type metal-oxide-semiconductor ("PMOS") transistors, but the embodiment of the invention is not limited thereto. In alternative embodiment of the invention, the pixel circuit CC may include n-type metal-oxide-semiconductor ("NMOS") transistors. In another alternative embodiment of the invention, the pixel PX may include a combination of a NMOS transistor and a PMOS transistor.

Figure 6A:
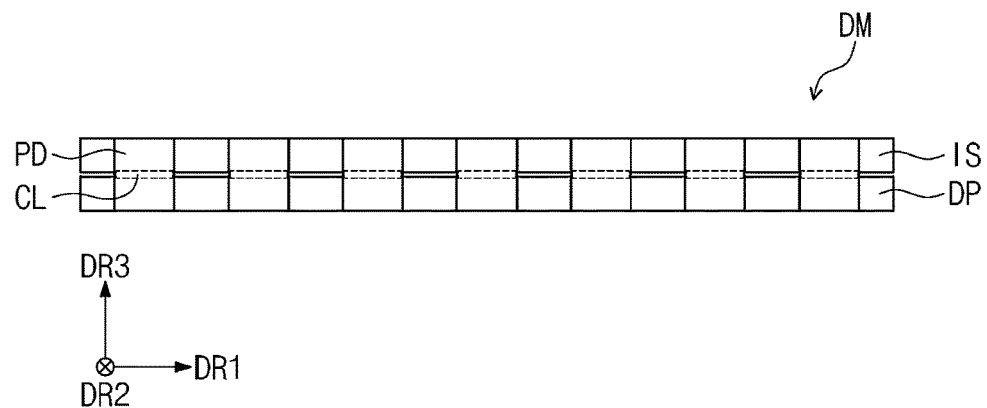
FIG. 6A is an enlarged plan view illustrating one side surface of a display module according to an embodiment.
Figure 6B:
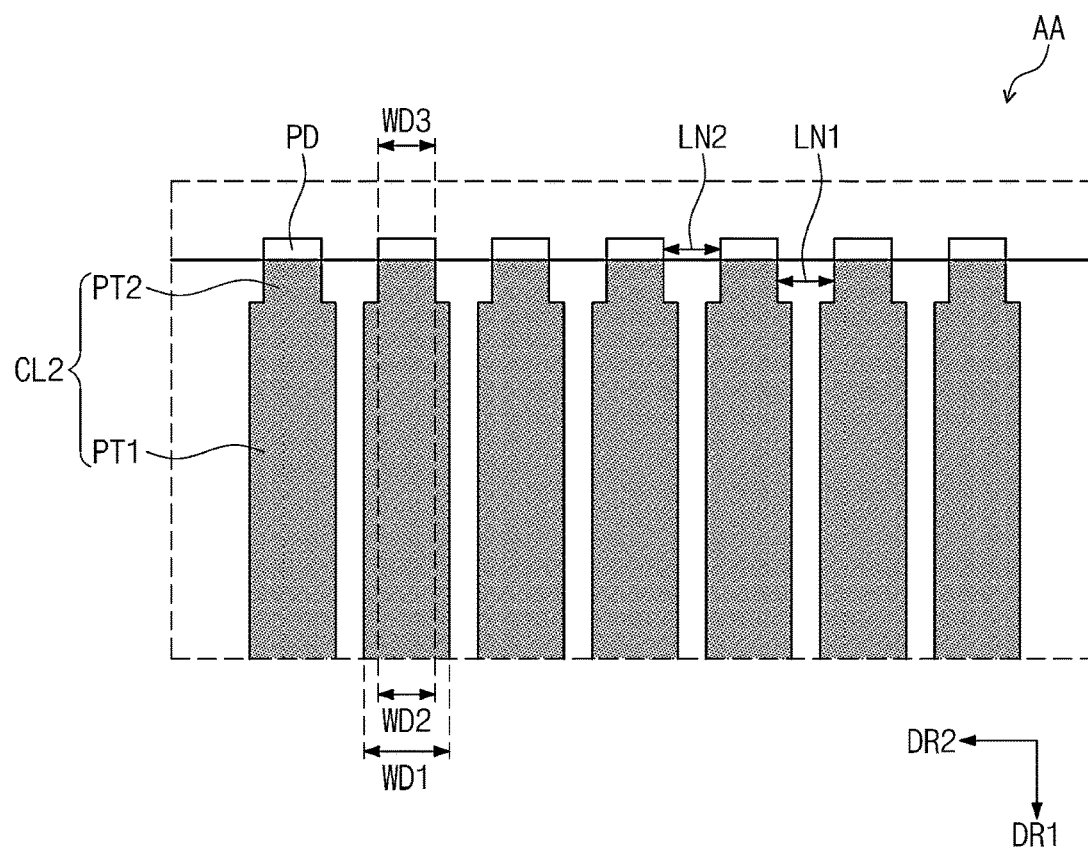
FIG. 6B is an enlarged plan view illustrating area AA of FIG. 4.

FIG. 6A is an enlarged plan view illustrating a portion of the side surface CM-DM of the display module DM. FIG. 6B is an enlarged plan view illustrating area AA of FIG. 4A.

Referring to FIGS. 6A and 6B, an embodiment of the display module DM may include the plurality of connection lines CL and the plurality of pads PD. The plurality of pads PD may be disposed on a side surface CM-DM of the display module DM.

In an embodiment, as illustrated in FIG. 6B, each of a plurality of connection lines CL2 includes a first area PT1 and a second area PT2. The second area PT2 extends from the first area PT1. The first area PT1 and the second area PT2 may be integrally formed with each other as a single unitary unit. The second area PT2 may be disposed adjacent to the plurality of pads PD.

In an embodiment of the invention, the second area PT2 is electrically connected to the plurality of pads PD. In such an embodiment, the second area PT2 may contact the plurality of pads PD.

In an embodiment, the first area PT1 has a width WD1 greater than a width WD2 of the second area PT2. The width WD2 of the second area PT2 is substantially the same as a width WD3 of each of the plurality of pads PD. The width WD2 of the second area PT2 may be in a range from about 5 μm to about 15 μm. The width WD3 of each of the plurality of pads PD may be in a range from about 5 μm to about 15 μm. Herein, a width may represent a length in the second direction DR2 or a direction perpendicular to an extending direction.

In an embodiment, the plurality of connection lines CL2 may be spaced apart from each other. In such an embodiment, the plurality of pads PD may be spaced apart from each other. The second areas PT2 of the plurality of connection lines CL2 may be spaced apart from each other at a distance LN1 in a range from about 5 μm to about 15 μm. The plurality of pads PD may be spaced apart from each other at a distance LN2 in a range from about 5 μm to about 15 μm. In this specification, a distance may represent a distance between two adjacent element in the second direction DR2.

In an embodiment, the plurality of pads PD may overlap the plurality of connection lines CL2 on the side surface CM-DM of the display module DM. In an embodiment, opposing sides of the second area PT2 of each of the plurality of connection lines CL2 may coincide with opposing sides of each of the plurality of pads PD, respectively. In such an embodiment, the plurality of pads PD may be electrically connected to the plurality of connection lines CL2. The plurality of pads PD may contact the plurality of connection lines CL2.

In such an embodiment, where the opposing sides of the second area PT2 of each of the plurality of connection lines CL2 coincide with the opposing sides of each of the plurality of pads PD, respectively, a short generated between the plurality of connection lines CL2 and the plurality of pads PD may be effectively prevented.

In such an embodiment, where the opposing sides of the second area PT2 of each of the plurality of connection lines CL2 coincide with the opposing sides of each of the plurality of pads PD, respectively, a pitch between the plurality of pads PD may be effectively controlled in a range from about 10 μm to about 30 μm. Thus, in such an embodiment, the display device may have improved reliability.

Figure 7:
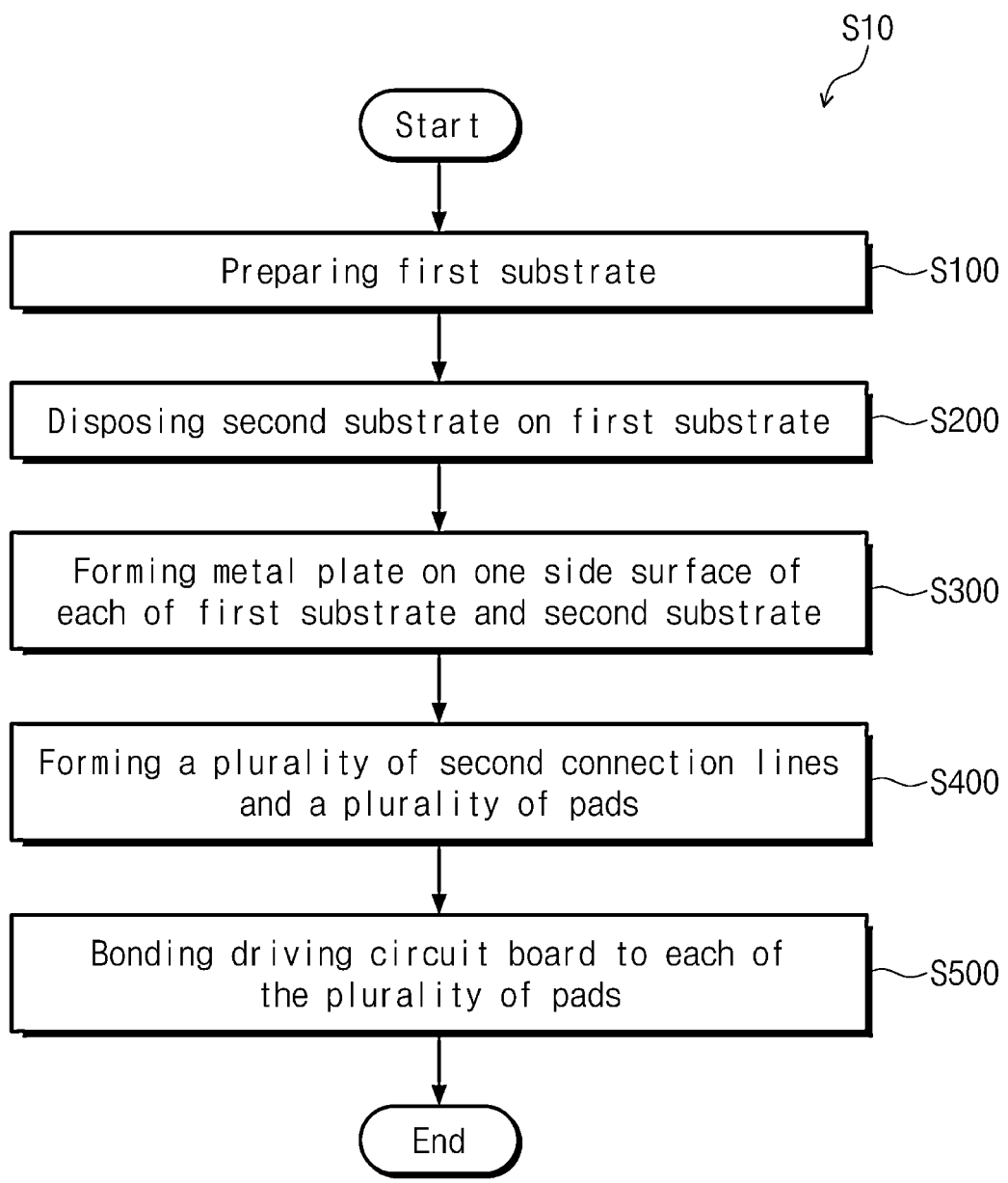
FIG. 7 is a flowchart illustrating a method for manufacturing a display device according to an embodiment.

FIG. 7 is a flowchart S10 illustrating a method for manufacturing a display device DD according to an embodiment. FIGS. 8A to 8D are perspective views illustrating a portion of processes of the method for manufacturing the display device DD according to an embodiment. FIGS. 9A and 9B are cross-sectional views illustrating a portion of processes of the method for manufacturing the display device DD according to an embodiment. In FIGS. 8A to 8D, each of the processes of the method for manufacturing the display device DD in a partial area of one side surface CM-CM of a display module DM is schematically illustrated. In FIGS. 9A and 9B, a portion of the processes of the method for manufacturing the display device DD in area AA of FIG. 4 is schematically illustrated.

Referring to FIG. 7, an embodiment of the method for manufacturing the display device DD includes: a process S100 of preparing a first substrate DP; a process S200 of disposing a second substrate IS on the first substrate DP; a process S300 of providing or forming a metal plate MP on one side surface of each of the first substrate DP and the second substrate IS; a process S400 of providing or forming a plurality of second connection lines CL2 and a plurality of pads PD; and a process S500 of bonding a driving circuit board DCB to each of the plurality of pads PD.

In an embodiment, the process S100 of preparing the first substrate DP may include a process of providing or forming a plurality of first connection lines CL1 on one end of a base layer BL. In an embodiment, the plurality of first connection lines CL1 may be spaced apart from each other.

The plurality of first connection lines CL1 may include or be made of a metal material including copper (Cu), silver (Ag), gold (Au), or aluminum (Al). Each of the plurality of first connection lines CL1 may be a single layer or a laminated plurality of layers. In an embodiment, each of the plurality of first connection lines CL1 may be formed by laminating a metal layer including the above-described metal material and an insulation layer alternately with each other. However, the embodiment of the invention is not limited thereto.

Figure 8A:
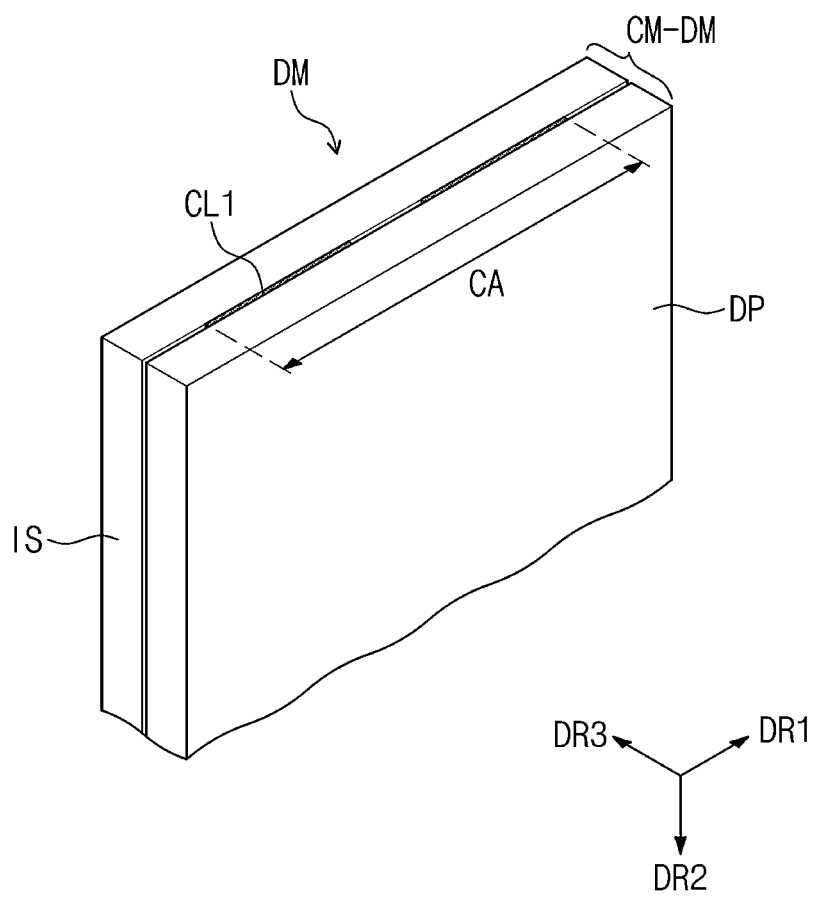
FIGS. 8A, 8B, 8C, and 8D are perspective views of a portion of a display module illustrating the method for manufacturing a display device according to an embodiment.
Figure 9A:
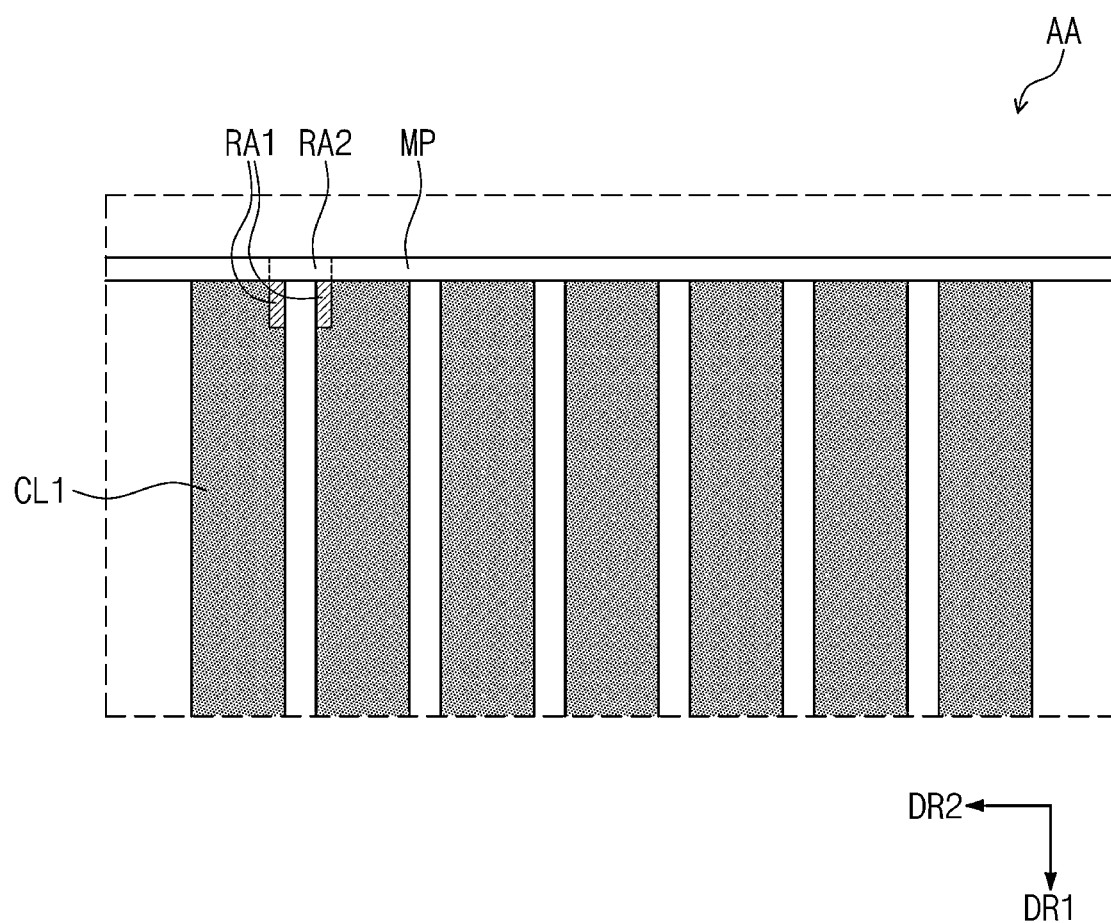
FIGS. 9A and 9B are enlarged plan views of area AA of FIG. 4 illustrating the method for manufacturing a display device according to an embodiment.
Figure 9B:
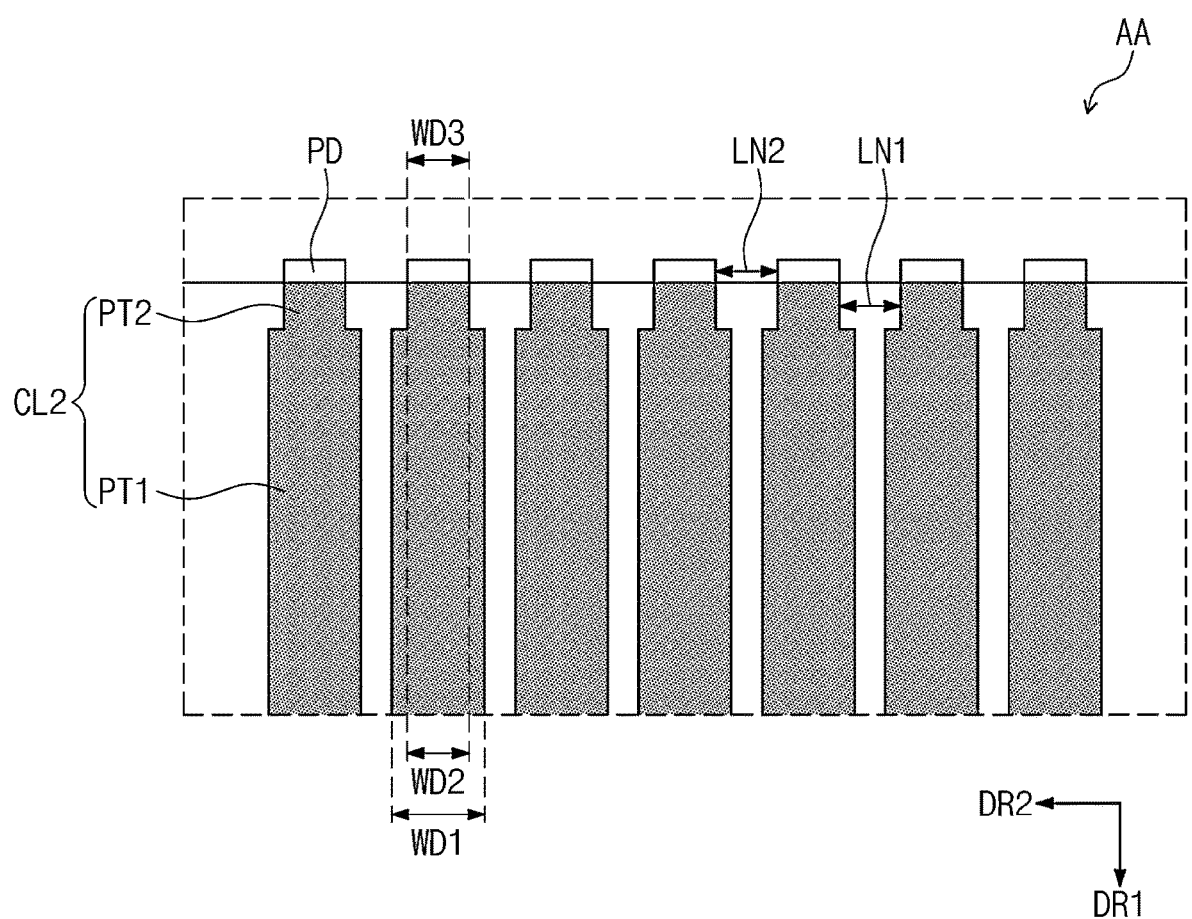

In an embodiment, as illustrated in FIG. 8A, the process S200 of disposing the second substrate IS on the first substrate DP may be a process of disposing the second substrate IS on the plurality of first connection lines CL1. The second substrate IS may be attached onto the first substrate DP through, e.g., an adhesive member. In one embodiment, for example, the adhesive member may be a sealing member. However, the embodiment of the invention is not limited thereto. The second substrate IS may include an input sensing unit. In such an embodiment, the second substrate IS may be substantially the same as the second substrate IS described above, and thus any repetitive detailed description thereof will hereinafter be omitted.

The display module DM may include the first substrate DP and the second substrate IS. Herein, one side surface of each of the first substrate DP and the second substrate IS may refer to the side surface CM-DM of the display module DM.

In such an embodiment, a connection area CA of the base layer BL described above may be substantially the same as that of the first substrate DP. In the first substrate DP, an area on which the plurality of first connection lines CL are disposed may be referred to as the connection area CA.

Figure 8B:
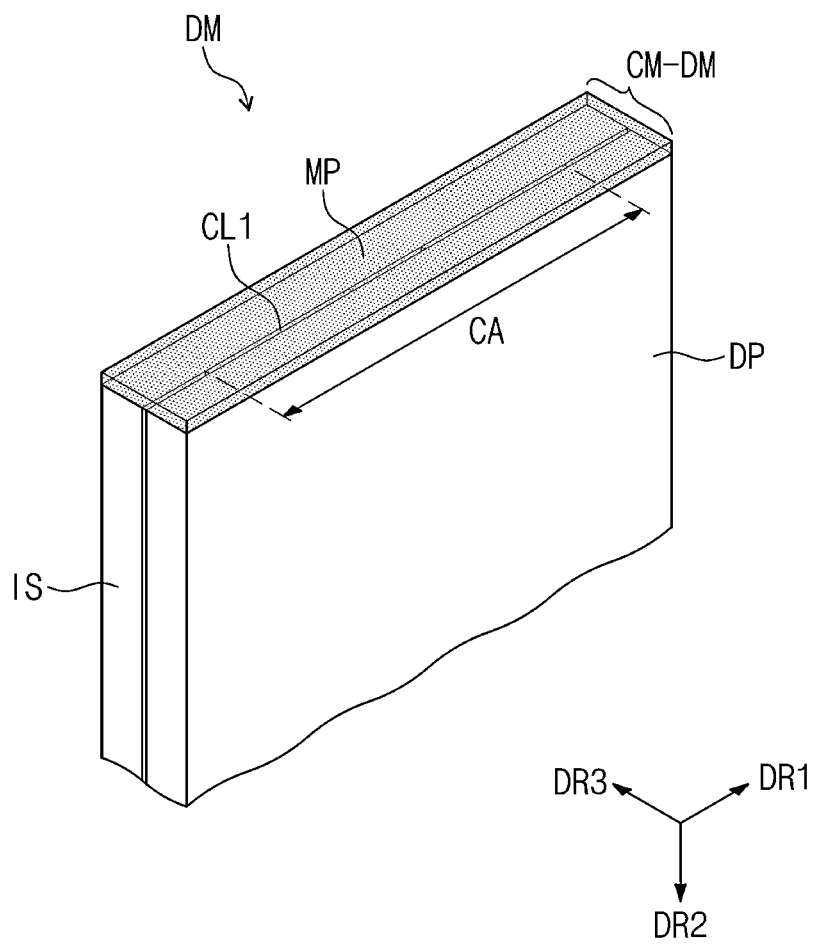

In an embodiment, as illustrated in FIG. 8B, the process S300 of forming the metal plate MP on one side surface of each of the first substrate DP and the second substrate IS may form the metal plate MP on the side surface CM-DM of the display module DM. In such an embodiment, the metal plate MP may be formed to overlap an entire surface of a connection area CA of the side surface CM-DM of the display module DM.

In one embodiment, for example, the metal plate MP may be formed to directly contact the side surface CM-DM of the display module DM through a sputtering. Alternatively, the metal plate MP may be formed to directly contact the side surface CM-DM of the display module DM through a silver paste. However, the embodiment of the invention is not limited thereto.

Figure 8C:
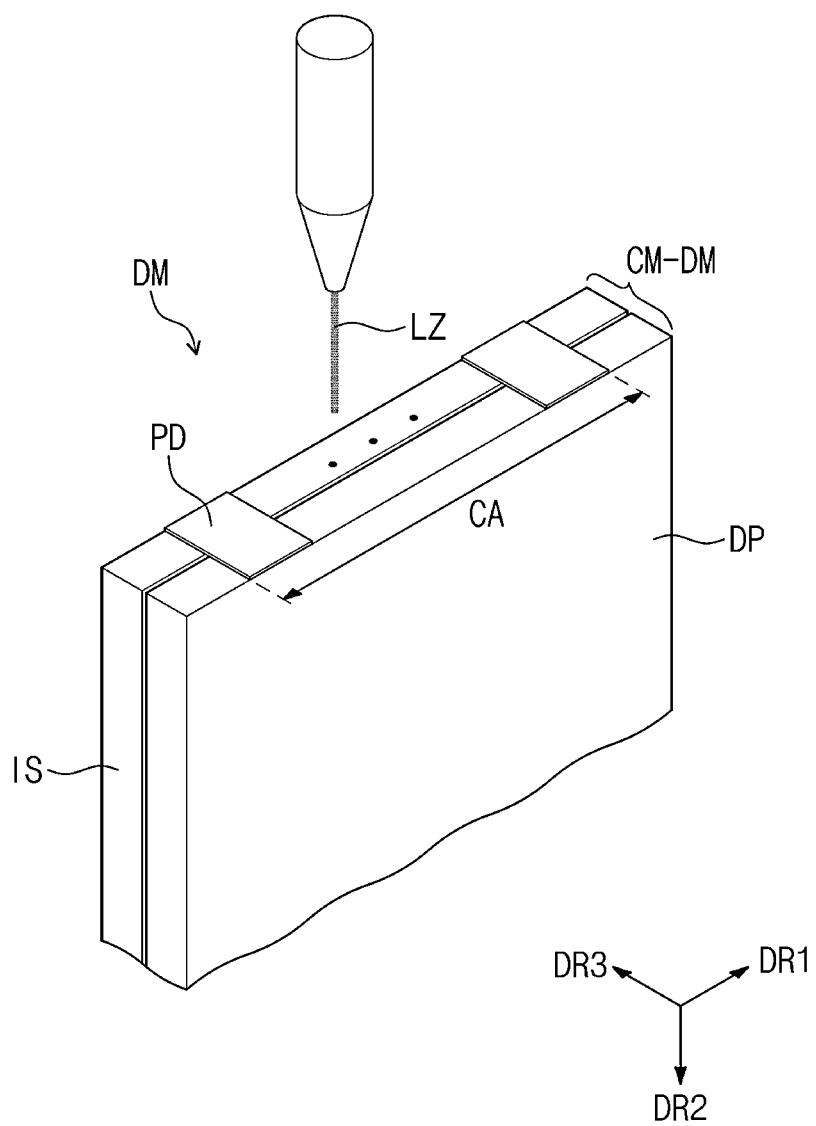

Referring to FIG. 8C, the process S400 of forming the plurality of second connection lines CL2 (refer to FIG. 6B) and the plurality of pads PD may include a process of irradiating the plurality of first connection lines CL1 and the metal plate MP with a laser LZ. In an embodiment of the invention, the process S400 may be the same as the process of irradiating the first connection lines CL1 and the metal plate MP with the laser LZ. In such an embodiment, as a partial area of each of the first connection lines CL1 and the metal plate MP is removed, the plurality of second connection lines CL2 (refer to FIG. 6B) and a plurality of pads PD may be formed.

Although two pads PD are exemplarily illustrated in FIG. 8C for convenience of illustration, a plurality of pads may be further disposed between the illustrated two pads PD. The plurality of second connection lines CL2 (refer to FIG. 6B) may be disposed between the first substrate DP and the second substrate IS and thus not seen from the outside. An area on which the plurality of pads PD are disposed may be defined as a connection area CA. The connection area CA may be an area in which the plurality of pads PD and the driving circuit DDC are electrically connected to each other.

Referring to FIG. 8C in conjunction with FIG. 6B, as the plurality of second connection lines CL2 and the plurality of pads PD are formed simultaneously with each other through a same process as each other, opposing sides of the second portion PT2 of each of the second connection lines CL2 may coincide with opposing sides of each of the plurality of pads PD. Thus, a short generated between the second connection lines CL2 and the plurality of pads PD may be effectively prevented.

Figure 8D:
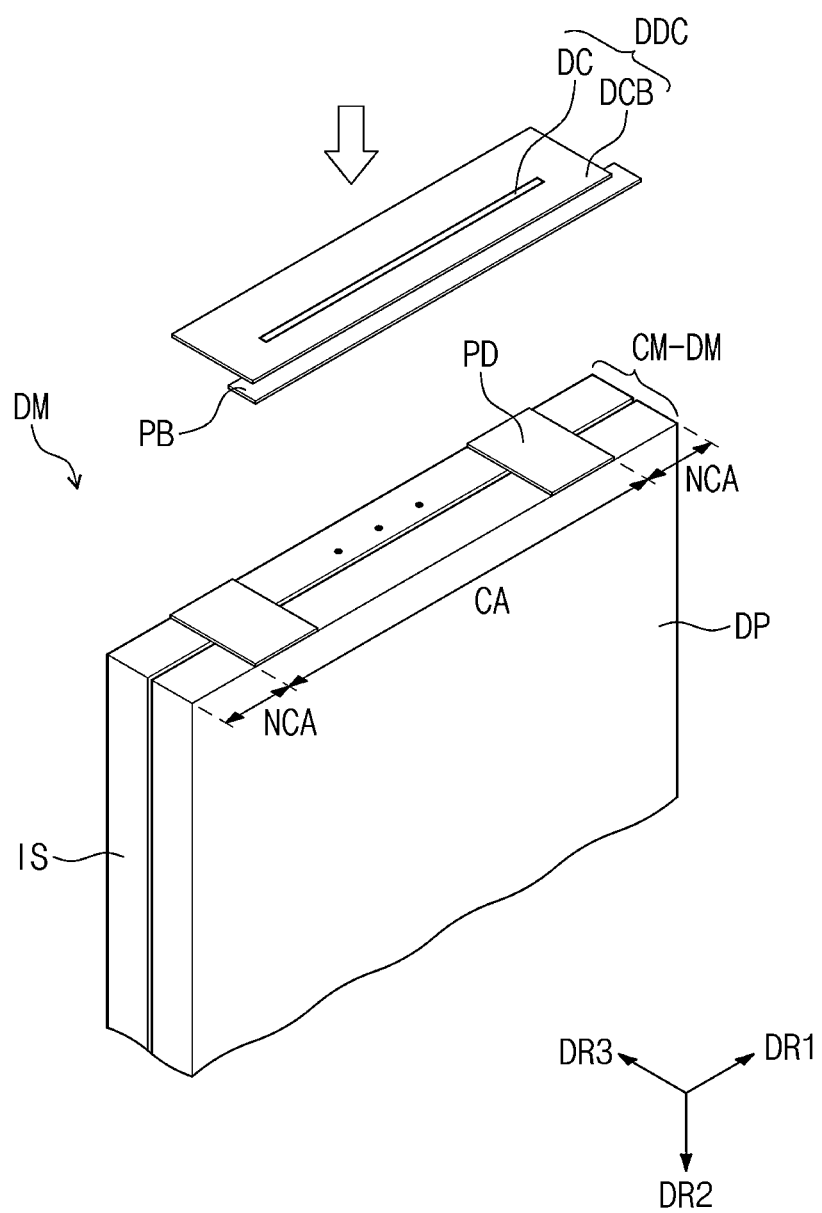

In an embodiment, as illustrated in FIG. 8D, the process S500 of bonding the driving circuit board DCB to each of the plurality of pads PD may electrically connect the driving circuit board DCB to the plurality of pads PD. In an embodiment, the side surface CM-DM of the display module DM may include a connection area CA and a non-connection area NCA. The connection area CA may be an area in which the driving circuit DDC and the plurality of pads PD are electrically connected to each other. Thus, the driving circuit board DCB of the driving circuit DDC may be electrically connected to the plurality of pads PD.

In one embodiment, for example, the driving circuit DDC may contact the plurality of pads PD through an MDB that is an ultrasonic bonding. In an embodiment, the driving circuit DDC may be electrically connected to a printed circuit board PB. Thus, a signal transmitted from the printed circuit board PB may be transmitted to the plurality of pads PD through the driving circuit DDC.

In an embodiment, the opposing sides of the second area PT2 coincide with the opposing sides of each of the plurality of pads PD, such that a short generated between the plurality of pads PD and the second connection lines CL2 may be effectively prevented, and the signal transmitted from the plurality of pads PD may be transmitted to the display module DM through the second connection lines CL2.

In FIG. 9A, two first removal areas RA1 and a second removal area RA2 are illustrated. Referring to FIG. 9B, the two first removal areas RA1 and the second removal area RA2 may be removed by irradiating the first connection lines CL1 and the metal plate MP with the laser LZ.

In an embodiment, as illustrated in FIG. 9A, the first removal area PA1 may be removed by irradiating the plurality of first connection lines CL1 with the laser LZ. As the first removal area PA1 is removed from each of the plurality of first connection lines CL1, the plurality of second connection lines CL2 may be formed. Each of the plurality of second connection lines CL2 may include a first area PT1 and a second area PT2. The first area PT1 may be an area that is not irradiated with the laser LZ. The second area PT2 may be an area from which the first removal area RA1 is removed by being irradiated with the laser LZ. Thus, the first area PT1 has a width WD1 greater than a width WD2 of the second area PT2 from which the first removal area RA1 is removed.

In an embodiment, the second removal area RA2 may be removed by irradiating the metal plate MP with the laser LZ. The second removal area RA2 may be removed from the metal plate MP, and then a plurality of pads PD may be formed to be spaced apart from each other.

In an embodiment of the invention, the removing of the first removal area RA1 by irradiating the plurality of first connection lines CL1 with the laser LZ and the process of removing of the second removal area RA2 by irradiating the metal plate MP with the laser LZ may be performed in a same process. In such an embodiment, the plurality of connection lines CL2 and the plurality of pads PD may be formed simultaneously with each other in the same process.

In an embodiment of the method for manufacturing the display device according to the invention, an intensity of the laser LZ may be adjusted to form the plurality of connection lines CL2 and the plurality of pads PD by irradiating the plurality of first connection lines CL1 and the metal plate MP with the laser LZ in a same process. In such an embodiment, the number, time, and overlap ratio of irradiation of the laser LZ may be adjusted to form each of the plurality of connection lines CL2 and the plurality of pads PD by simultaneously patterning the first connection lines CL1 and the metal plate MP.

In an embodiment, referring to FIG. 9B, as the first removal area PA1 and the second removal area RA2 are removed simultaneously with each other by a same process, the opposing sides of the second area PT2 may be adjusted to coincide with the opposing sides of each of the plurality of pads PD. Thus, the width WD2 of the second area PT2 is substantially the same as a width WD3 of each of the plurality of pads PD. In one embodiment, for example, the width WD2 of the second area PT2 may be in a range from 5 µm to about 15 µm. In such an embodiment, the width WD3 of each of the plurality of pads PD may be in a range from 5 µm to about 15 µm. Here, the feature in which the width WD2 of the second area PT2 is substantially the same as a width WD3 of each of the plurality of pads PD may represent a feature of having the substantially same width in consideration of an error range in a process.

In an embodiment of the method for manufacturing the display device according to the invention, the plurality of second connection lines CL2 and the plurality of pads PD are formed simultaneously with each other in a same process, such that the opposing sides of the second area PT2 may coincide with the opposing sides of each of the plurality of pads PD. Thus, a short, which may be generated between the plurality of connection lines CL and the plurality of pads PD, may be effectively prevented, and thus the display device DD may have improved reliability.

In embodiments, the display panel may have the reduced bezel area.

In embodiments, the display device may have the reduced bezel area.

Embodiments of the method for manufacturing the display device may provide the display device having improved reliability.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display panel comprising:
   a base layer comprising a display area and a non-display area adjacent to the display area;
   a plurality of connection lines disposed on the non-display area of the base layer, and extending to a side surface of the base layer; and
   a plurality of pads disposed on the side surface and electrically connected to the plurality of connection lines, respectively,
   wherein each of the plurality of connection lines comprises a first area adjacent to the display area and a second area extending from the first area to the side surface of the base layer,
   the second area is disposed adjacent to the plurality of pads,
   the first area has a width greater than a width of the second area, and
   the width of the second area is substantially the same as a width of each of the plurality of pads.

2. The display panel of claim 1, wherein opposing sides of the second area of each of the plurality of connection lines coincide with opposing sides of each of the plurality of pads.

3. The display panel of claim 1, wherein the plurality of connection lines contacts the plurality of pads, respectively.

4. The display panel of claim 1, wherein
   the plurality of connection lines is spaced apart from each other with a substantially constant interval, and
   the plurality of pads is spaced apart from each other with a substantially constant interval.

5. The display panel of claim 4, wherein
   the plurality of connection lines is spaced apart from each other at a distance in a range from about 5 µm to about 15 µm,
   the plurality of pads is spaced apart from each other at a distance in a range from about 5 µm to about 15 µm, and
   each of the plurality of pads has a width in a range from about 5 µm to about 15 µm.

6. A display device comprising:
   a first substrate; and
   a second substrate disposed on the first substrate and comprising an input sensing unit,
   wherein the first substrate comprising:
      a base layer comprising a display area and a non-display area;
      a plurality of connection lines disposed on the non-display area of the base layer, and extending to a side surface of the base layer; and
      a plurality of pads disposed on the side surface and electrically connected to the plurality of connection lines, respectively,
   wherein each of the plurality of connection lines comprises a first area and a second area extending from the first area to the side surface of the base layer,
   the second area is disposed adjacent to the plurality of pads,
   the first area has a width greater than a width of the second area, and
   the width of the second area is substantially the same as a width of each of the plurality of pads.

7. The display device of claim 6, wherein opposing sides of the second area of the plurality of connection lines coincide with opposing sides of each of the plurality of pads.

8. The display device of claim 6, wherein the plurality of connection lines contact the plurality of pads, respectively.

9. The display device of claim 6, wherein
   the plurality of connection lines is spaced apart from each other with a substantially constant interval, and
   the second areas of the plurality of connection lines are spaced apart from each other at a distance in a range from about 5 µm to about 15 µm.

10. The display device of claim 6, wherein
    the plurality of pads is spaced apart from each other with a substantially constant interval, and
    a distance between two adjacent pads of the plurality of pads is in a range from about 5 µm to about 15 µm.

11. The display device of claim 6, wherein each of the plurality of pads has a width in a range from about 5 µm to about 15 µm.

12. The display device of claim 6, further comprising:
    a driving circuit board electrically connected to the plurality of pads.

13. The display device of claim 12, wherein the driving circuit board is a flexible circuit board.

14. The display device of claim 6, wherein the first substrate further comprises a light emitting element disposed on the display area.

* * * * *